(12) United States Patent
Löwen (10) Patent No.: US 11,785,727 B2
(45) Date of Patent: Oct. 10, 2023

(54) LOCKING PIN, ELECTRONICS MODULE AND PRODUCTION METHOD

(71) Applicant: TURCK Holding GmbH, Halver (DE)

(72) Inventor: Nikolaj Löwen, Wuppertal (DE)

(73) Assignee: TURCK Holding GmbH, Halver (DE)

( * ) Notice: Subject to any disclaimer, the term of this patent is extended or adjusted under 35 U.S.C. 154(b) by 0 days.

(21) Appl. No.: 17/809,355

(22) Filed: Jun. 28, 2022

(65) Prior Publication Data

US 2023/0007790 A1 Jan. 5, 2023

(30) Foreign Application Priority Data

Jul. 1, 2021 (DE) .......................... 102021116940.2

(51) Int. Cl.
*H05K 5/00* (2006.01)
*G06F 1/18* (2006.01)
(52) U.S. Cl.
CPC ............. *H05K 5/006* (2013.01); *G06F 1/185* (2013.01)
(58) Field of Classification Search
CPC .............................. H05K 5/0052; H05K 5/006
See application file for complete search history.

(56) References Cited

U.S. PATENT DOCUMENTS

| 5,535,100 | A | 7/1996 | Lubahn et al. | |
| 6,839,240 | B2 * | 1/2005 | Skofljanec | H05K 7/142 |
| | | | | 361/752 |
| 10,368,453 | B2 * | 7/2019 | Drew | H05K 5/069 |
| 10,928,441 | B2 | 2/2021 | Kanosue | |
| 2013/0343015 | A1 * | 12/2013 | Malek | G06F 1/183 |
| | | | | 361/752 |

(Continued)

FOREIGN PATENT DOCUMENTS

BE 824335 A 5/1975
DE 9110871 U1 10/1991
(Continued)

OTHER PUBLICATIONS

Search Report in DE Appl. No. 102021116940.2 dated Feb. 22, 2022, 8 pages.

(Continued)

*Primary Examiner* — Hung V Ngo
(74) *Attorney, Agent, or Firm* — Kowert, Hood, Munyon, Rankin & Goetzel, P.C.

(57) ABSTRACT

Techniques are disclosed relating to a locking pin used to secure components in an electronics module. For example, in some embodiments an electronics module includes a housing lower part that includes a lower receiving element and a housing upper part that includes an upper receiving element that is aligned with the lower receiving element. In various embodiments, a locking pin may be used to connect a circuit board in the electronics module. For example, in some embodiments the circuit board includes at least one lead-through opening and the circuit board is connected to the housing lower part via the locking pin that is inserted in a positive-locking manner through the lead-through opening into the lower receiving element. Further, in some embodiments, an upper pin section of the locking pin may be inserted into an upper receiving element of the housing upper part in a positive-locking manner.

10 Claims, 3 Drawing Sheets

(56) References Cited

U.S. PATENT DOCUMENTS

| | | | |
|---|---|---|---|
| 2015/0313035 A1* | 10/2015 | Kroeckel | H05K 5/0069 |
| | | | 361/759 |
| 2017/0210308 A1* | 7/2017 | Haemmerl | H05K 5/0052 |
| 2017/0251565 A1* | 8/2017 | Ferran, Palau | H05K 7/142 |
| 2017/0311458 A1* | 10/2017 | Drew | H05K 5/0052 |
| 2017/0311460 A1* | 10/2017 | Ozaki | H02G 15/06 |
| 2018/0014418 A1* | 1/2018 | Kang | H05K 5/0047 |
| 2020/0146161 A1* | 5/2020 | Zack | H05K 3/0061 |

FOREIGN PATENT DOCUMENTS

| | | |
|---|---|---|
| DE | 9214673 U1 | 12/1992 |
| DE | 10315432 A1 | 10/2004 |
| DE | 102010063151 A1 | 6/2012 |
| WO | 2012/079837 A1 | 6/2012 |
| WO | WO 2018/031508 * | 2/2018 |

OTHER PUBLICATIONS

European Search Report in EP Appl. No. 22177196.7 dated Nov. 23, 2022, 9 pages.
European Search Report in EP Appl. No. 22177196.7 dated Nov. 23, 2022, 14 pages.

* cited by examiner

LOCKING PIN, ELECTRONICS MODULE AND PRODUCTION METHOD

PRIORITY CLAIMS

The present application claims priority under 35 U.S.C. § 119 to German patent application 10 2021 116 940.2, filed Jul. 1, 2021, the disclosure of which is incorporated by reference herein in its entirety.

BACKGROUND

Technical Field

This disclosure relates generally to electronic components, and more particularly locking pins utilized to secure circuit boards within electronics modules.

Description of the Related Art

Prior techniques have been used to fasten a circuit board inside an electronics module. For example, one approach fastens the circuit board to a housing underside with a spacer by inserting spacing and fastening elements made of plastic with snap-fits into a housing wall and fastening them. In another approach, the circuit board is mounted in a floating manner by setting a vertical position via several nuts along the screws.

These and other prior techniques suffer from various technical shortcomings, however. For example, one disadvantage of prior techniques is that they require many fastening components and a high manufacturing outlay. Further, in prior approaches, a large surface area on the circuit board is often used up for the fastening such that this surface area can no longer be utilized in a functional manner for actual electrical or data-carrying processes.

DETAILED DESCRIPTION

Prior techniques have been used to fasten a circuit board inside of electronic components. For example, U.S. Pat. No. 5,535,100 describes fastening a circuit board to a housing underside with a spacer by inserting spacing elements and fastening elements made of plastic with snap-fits into a housing wall and fastening them. The circuit board is placed on and locked in position. As another example, U.S. Pat. No. 10,928,441 describes a fastening for a circuit board using screws in which the board is mounted in a floating manner by setting a vertical position via several nuts along the screws.

Such techniques present various technical shortcomings. For example, one disadvantage of these prior techniques is that they require many fastening components and a high manufacturing outlay. Furthermore, these techniques require a large surface area on the circuit board to be used for the fastening such that these sections of the board can no longer be utilized in a functional manner for electrical or data-carrying processes.

Various disclosed embodiments provide techniques that improve the fastening of circuit boards within a housing by avoiding the above-mentioned technical problems. For example, in some embodiments the disclosed techniques use a locking pin for connecting components of an electronics module, where the locking pin provides for the friction-locking (also referred to as "positive-locking") introduction into an at least partially surrounding receiving element. In some embodiments, the locking pin includes at least one contact section and a first pin section with a head end and a connecting neck section, where at least one single-part or multi-part cutting or friction collar is arranged in the area of the head end or of the neck section. Further, in various embodiments, the disclosed locking pin further includes a second pin section is arranged on the other side of the contact section, where the second pin section likewise has a head end and a connecting neck section, and where at least one single-part or multi-part cutting or friction collar is arranged in the area of the head end or of the neck section. Note that, as used herein, the term "cutting or friction collar" (also referred to as a "cutting and/or friction collar") is used broadly to refer to any suitable surface geometries or finishes of the locking pin, or sections thereof, which lead to the locking pin cutting into or pushing into an opposite or encompassing surface of a receiving element. Various non-limiting examples of surface geometries or surface finishes of the locking pin that may be used in a cutting or friction collar are described in greater detail below.

The disclosed embodiments may provide various technical advantages. For example, in some embodiments, through a simple plugging or pressing into one another, the circuit board may be centered on the receiving elements of the housing lower part and permanently pressed onto the receiving elements by the protruding contact section of the locking pin. Further, in various embodiments, the housing upper part may likewise be simply "pressed-on." For example, in some non-limiting embodiments the housing upper part may be pressed onto all locking pins at the same time (e.g., in a single step).

In various embodiments, the locking pin may be formed symmetrical with respect to the two pin sections, where the second pin section is advantageously designed to be shorter than the first pin section. For example, depending on the thickness of the circuit board, the length of the second pin section (e.g., an upper pin section) may be 0.25 times to 0.75 times that of the first pin section (e.g., a lower pin section).

In some embodiments, at least one of the head ends is designed as a mushroom head-like or cap-like widening, where the circumferential lower rim is designed as a cutting collar. Alternatively (or additionally) the outer surface of the mushroom head-like or cap-like head end may have knurled surfaces or surfaces formed with barbed hooks, in particular in the edge area, according to some embodiments. For example, in some embodiments a pin section (e.g., an upper or lower pin section) may have a head end formed as a cap-like widening with a circumferential lower rim that acts as a cutting collar. In some such embodiments, the cap-like widening may also include a frictional surface finish (such as a knurled surface, for example). In other embodiments, instead of a cap-like widening, a pin section (e.g., an upper or lower pin section) may include one or more cutting or friction collars, some, all, or none of which may also include a frictional surface finish. Additional non-limiting embodiments are depicted in, and described with reference to, FIGS. 1a-1b and 2a-2b.

The surfaces of a cutting or friction collar may have many various forms. Non-limiting examples of such surfaces for the cutting or friction collar include barbed hooks, or knurling or sharp grooves over the whole circumference or in sections of the collar. Note that, regardless of the particular frictional surface finish utilized by a cutting or friction collar, in various embodiments a common attribute of the cutting or friction collars is that they can be easily introduced in the mounting direction and, due to the ridging grip firmly on the wall or in wall sections of a receiving element, they cannot be pulled out or unscrewed in a non-destructive manner (e.g., without at least partially destroying or damaging either the cutting or friction collar or the receiving element).

Further, in some embodiments, a single- or multi-part cutting or friction collar is arranged on at least one neck section. In some such embodiments, for example, several cutting or friction collars may be arranged on a neck section. Similarly, in various embodiments a first or section pin section (or both) may have frictional surface geometries (such as knurling) applied to an entirety of the circumference of the neck section or may have multiple portions of the frictional surface geometry applied to different sections of the circumference of the neck section.

The locking pin may be constructed from various materials. In some embodiments, for example, the locking pin is made of a metal, such as a non-rusting metal. In other embodiments, the locking pin is made of a plastic, such as PVC (polyvinyl chloride), PP (polypropylene), POM (polyoxymethylene), PET (polyethylene terephthalate), or any other suitable plastic material.

As noted above, in various embodiments the disclosed locking pin is configured to secure a circuit board within a housing to form an electronics module. In some such embodiments, for example, the electronics module includes a housing lower part, a circuit board (or simply "board"), and a housing upper part. In some embodiments, the circuit board has at least one lead-through opening for fastening with a fastening means (e.g., a locking pin) which is introduced, with a first end, in a friction-locking manner through the lead-through opening into a receiving element (arranged aligned) of the housing lower part and fastened.

In various embodiments of the disclosed electronics module, the housing lower part and the housing upper part are configured such that a lower receiving element in the housing lower part is arranged aligned with an upper receiving element in the housing upper part. In various embodiments, the other end of the fastening means (e.g., the locking pin) is introduced in a friction-locking manner into the upper receiving element of the housing upper part and fastened, for example pressed in a positive-locking manner.

In some embodiments, the lead-through openings of the circuit board are circumferential slots or openings. In other embodiments, however, one or more of the lead-through openings may be slots in the edge or rim area that are open towards the outside and, therefore, not circumferentially closed. The geometry of the lead-through openings in the circuit board may vary. In some embodiments, the lead-through openings may be oval or circular cutouts, for example.

In some embodiments, the housing upper part and the housing lower part may have edges that are sealed together by a sealing overlay, or adhesive bonded to one another by an adhesive applied to at least one section of one or more edges during production of the electronics module. In some embodiments, for example, these edges may be sealed together or adhesively bonded to one another over an entire length of the corresponding edges.

Further, in some embodiments, at least one of the upper or lower receiving elements is attached such that a bar-like bearing element is arranged between a housing wall and the receiving element(s). Alternatively, in some embodiments, at least one receiving element is attached on or to a housing wall, like a column or sleeve perpendicular to the circuit board, or is monolithically molded out of the housing wall.

In various embodiments, the housing lower part is the housing part to which the circuit board is fastened (e.g., as a first work step). In some such embodiments, the housing upper part may analogously be defined by the fact that it is the "other" housing part that does not represent the housing lower part. Note, however, that the terms "housing lower part" and "housing upper part" are not intended to limit the orientation of the installed position of the electronics module. For example, in some embodiments, in a final installed position, the housing lower part may be arranged such that it is above the housing upper part with respect to gravity.

Various disclosed embodiments include methods for producing an electronics module. For example, in some embodiments, a disclosed method includes attaching a circuit board, which has at least one lead-through opening, to a lower receiving element in a housing lower part using a fastening means (e.g., a locking pin) and then fastening a housing upper part using the fastening means. In some embodiments, the method includes performing the following steps: a) providing the housing lower part, b) placing the circuit board on one or more receiving elements of the housing lower part, c) guiding one or more fastening means through the lead-through openings and pressing them into the at least one receiving element, where the fastening means is a locking pin as described herein, and d) pressing the head end of the second pin section into at least one receiving element of the housing upper part. In some embodiments, at least one cutting or friction collar is pressed into each receiving element of the housing upper and lower parts in a friction-locking manner.

In some embodiments, this method of producing an electronics module may include applying a sealing or adhesive material to a housing edge at least in sections (for example before the pressing in of the housing upper part). Note that, in some instances, an advantage of such an embodiment is that a direct friction-locking connection is affected between the housing upper part and the housing lower part, including when a glue or adhesive is applied. As such, in some embodiments, no further fastening means may be required, including no holding and fastening means to temporarily ensure the necessary contact pressure for the period of the curing and drying of an adhesive. Accordingly, in some such embodiments the electronics module may be immediately transported or moved, including while the adhesive dries and cures.

Further details of various non-limiting embodiments are now described in more detail with reference to example embodiments depicted in the Drawings.

Figure 1A:
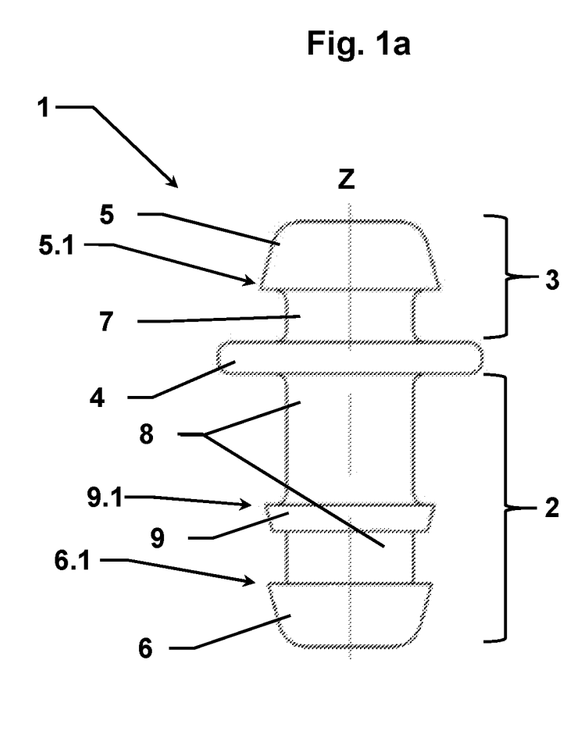
FIG. 1a is a block diagram showing a side view of a locking pin, according to some embodiments.
Figure 1B:
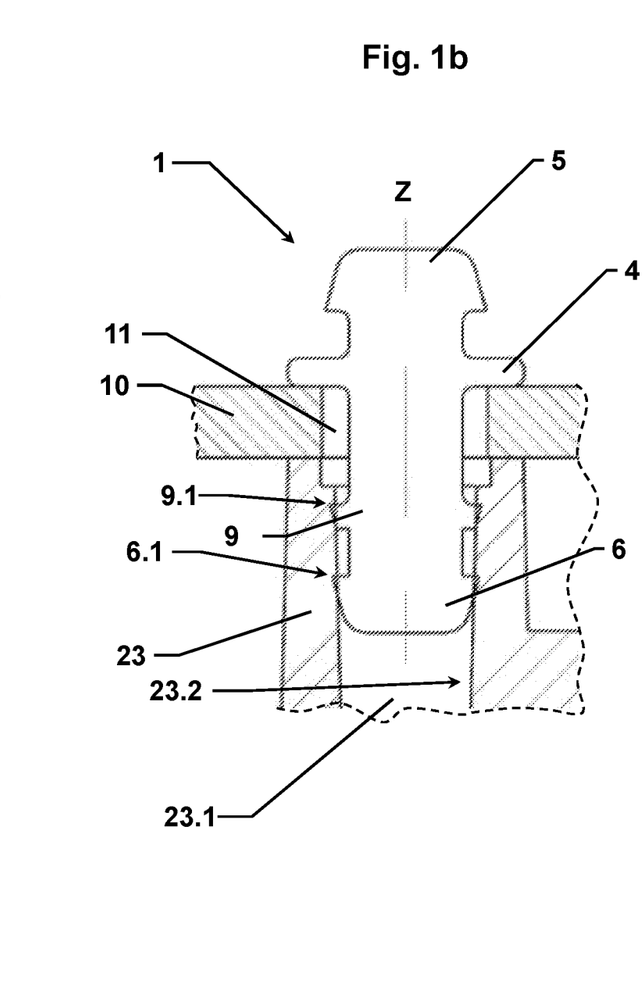
FIG. 1b is a block diagram showing a locking pin in an installed position, according to some embodiments.

In FIG. 1a, a side view of a locking pin 1 is shown, according to some embodiments. In the depicted embodiment, the locking pin 1 has a lower pin section 2 (sometimes referred to herein as a "first" pin section), an upper pin section 3 (sometimes referred to herein as a "second" pin section), and a contact section 4 arranged in between. In the depicted embodiment, the contact section 4 has a larger diameter than the two pin sections 2, 3. In various embodiments, the locking pin 1 depicted in FIG. 1a and FIG. 1b is formed rotationally symmetrical in relation to the vertical axis Z. Note, however, that this embodiment is provided merely as one non-limiting example and, in some embodiments, the locking pin 1 is not necessarily formed to be rotationally symmetrical relative to vertical axis Z.

In some embodiments, each of the two pin sections 2, 3 has a head end 6, 5 (respectively) that is connected in each case to the contact section 4 with a neck section 8, 7 (respectively). For example, in the depicted embodiment, lower pin section 2 has a head end 6, and upper pin section 3 has a head end 5. In some embodiments, both head ends 5, 6 are molded as mushroom head-like or cap-like widenings of the respective neck sections 7, 8. Further, in some embodiments, both head ends 5, 6 have, at their inner end that is closer to the contact section 4, a cutting rim 5.1, 6.1. In FIG. 1a, on the lower pin section 2—which in some non-limiting embodiments is twice as long as the upper pin section 3—a cutting or friction collar 9 is arranged, the circumferential surface of which is sloping towards the free end in the direction of the Z axis in order to facilitate the introduction into a receiving element 23. On its side closest to the contact section 4, the cutting or friction collar 9 has a cutting rim 9.1.

FIG. 1b shows the locking pin 1 in an installed position, according to some embodiments. In this embodiment, the lower pin section 2 of the locking pin 1 is guided through the lead-through opening 11 of the circuit board 10 and into the opening 23.1 of the receiving element 23. In FIG. 1b, the contact section 4 presses the circuit board 10 onto the upper rim of the receiving element 23 of the housing lower part 21 (depicted below in FIGS. 3a-3c), while the cutting rim 6.1 of the head end 6 and the cutting rim 9.1 of the cutting or friction collar 9 cut into the inside wall 23.2 of the receiving element 23. Accordingly, in some such embodiments, the cutting rim 6.1 of the head end 6 and the cutting rim 9.1 of the cutting or friction collar 9 are thus frictionally and positively fixed and may only be released again destructively. In the depicted embodiment, the upper head end 5 of the upper pin section 3 is still free, with the result that a housing upper part 22, or the receiving elements 24 thereof, may be attached and fastened to it, as shown in FIG. 3.

Figure 2A:
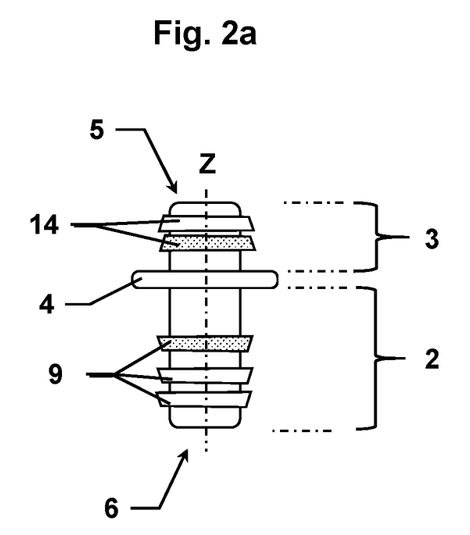
FIG. 2a is a block diagram depicting an additional non-limited embodiment of a locking pin.
Figure 2B:
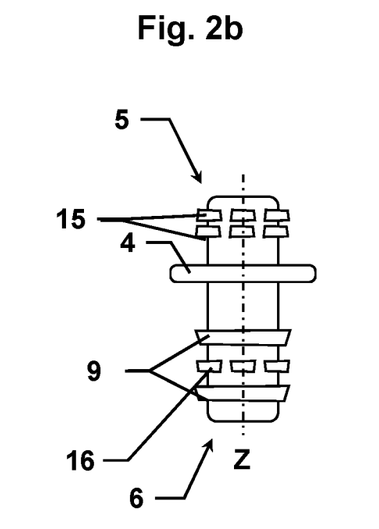
FIG. 2b is a block diagram depicting another additional non-limited embodiment of a locking pin.

Additional non-limiting embodiments of the locking pin 1 are shown in FIGS. 2a and 2b. Note that, in the embodiments depicted in FIGS. 2a and 2b, the locking pin 1 does not include a mushroom-like or cap-like head, but rather a plurality of cutting or friction collars 9, 14, 15, 16 are provided. For example, in the embodiment depicted in FIG. 2a, three circumferential, parallel cutting or friction collars 9 are arranged on the lower pin section 2 and two circumferential, parallel cutting or friction collars 14 are arranged on the upper pin section 3. In this depicted embodiment, in each case the lowest cutting or friction collar is provided with a surface knurling (which has been indicated by the dotting of the surface in FIGS. 2a-2b). As represented by way of example in FIG. 2b, in some embodiments the cutting or friction collars may be discontinuous or tooth- or ridge-like, as represented for the three of the cutting or friction collars 15, 16. In some such embodiments, the tooth-like cutting or friction collars consist of one or more circumferentially arranged ridge elements. (Note that, in some embodiments, the two pin sections 2, 3 are molded identically such that the locking pin 1 as a whole is molded symmetrically).

Figure 3A:
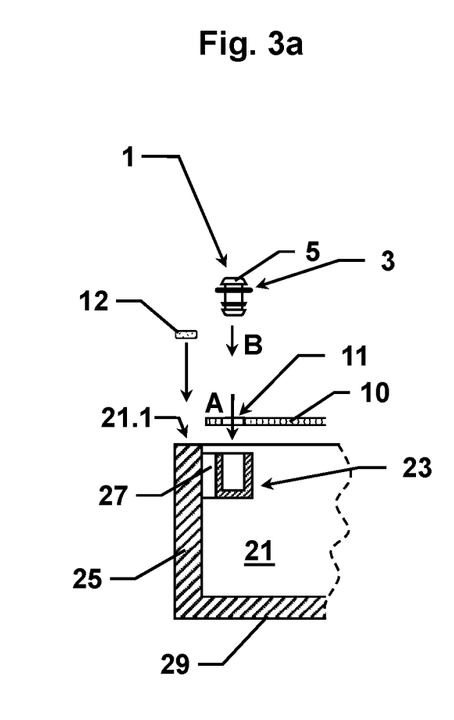
FIG. 3a depicts first steps in a method for producing an electronics module, according to some embodiments.
Figure 3B:
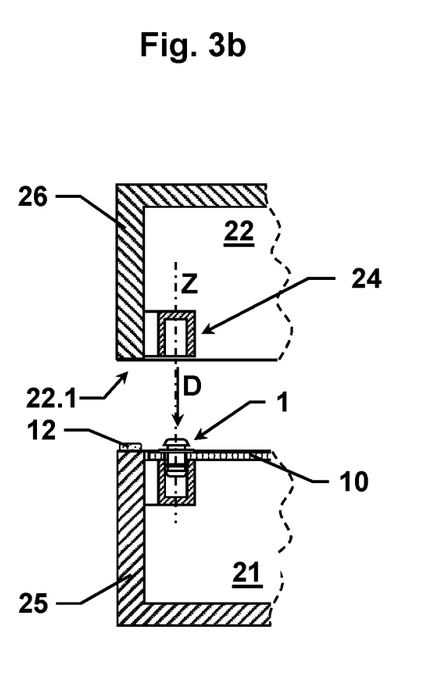
FIG. 3b depicts subsequent steps in a method for producing an electronics module, according to some embodiments.
Figure 3C:
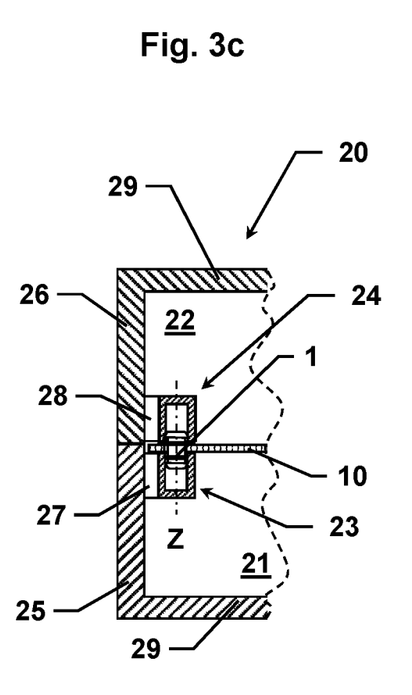
FIG. 3c depicts a locked electronics module, according to some embodiments, according to some embodiments.

In FIGS. 3a-3c, block diagrams depict stages in a production method, according to some embodiments. For example, FIG. 3a depicts the first steps of a production method according to some embodiments. In the depicted embodiment, the housing lower part 21 is provided and the circuit board 10 is placed on the receiving elements 23 (only one of which is depicted in FIG. 3a, for clarity) from above in the direction of the arrow A aligned with the openings 11. In the depicted embodiment, the receiving elements 23 is attached to bar-like bearing elements 27 on the housing wall 25. Then, in the depicted embodiment, the locking pin 1 is brought forward in direction B and pressed in, with the result that the circuit board 10 is fixed on the receiving element 23. In various embodiments, a liquid sealant and adhesive 12 may be applied to the housing edge 21.1 of the housing lower part 21 (at the same time as the above-mentioned steps or afterwards). Note that, in some embodiments, the housing edge or the housing wall can also have a tongue-and-groove form, such that a sealant and adhesive 12 may be poured into the groove, for example. Alternatively, in some embodiments the adhesive may be applied to the housing upper part 22.

After completion of the steps depicted in FIG. 3a, in various embodiments the housing upper part 22 is brought forward from above in direction D, as represented in FIG. 3b, where direction D corresponds to the axial direction Z of the inserted locking pin 1. In various embodiments, the housing upper part 22 is pressed onto all head parts 5 of the upper pin sections 3, where the beveled or round head shape facilitates an automatic centering of the entire housing upper part 22 and the receiving elements 24.

FIG. 3c shows the locked electronics module 20, according to some embodiments. In the depicted embodiment, the two receiving elements 23, 24 press the two housing parts together in a sealing manner through the pressed-in locking pins 1 via bearing elements 27, 28 on the respective housing walls 25, 26. In this embodiment, the circuit board 10 is held and centered parallel and without additional fastening means. Note that, in some embodiments, the receiving elements 23, 24 may be exclusively or additionally attached to the housing top 29. For example, in some non-limiting embodiments the receiving elements 23, 24 may be single- or multi-part sleeves.

The following set ("Set A") of numbered clauses set out various non-limiting embodiments disclosed herein:

A1. A locking pin (1) for connecting components of an electronics module, for the introduction and friction-locking and/or positive-locking into an at least partially surrounding receiving element (24), comprising at least one contact section (4) and a first pin section (2) with a head end (6) and a connecting neck section (8), wherein at least one single- or multi-part cutting and/or friction collar (6.1, 9.1) is arranged in the area of the head end (6) and/or of the neck section (8), characterized in that:

a second pin section (3) is arranged on the rear side of the contact section (4), wherein the second pin section (3) has a head end (5) and a connecting neck section (7), and wherein at least one single- or multi-part cutting and/or friction collar (5.1) is arranged in the area of the head end (5) and/or of the neck section (7).

A2. The locking pin (1) according to clause A1, characterized in that the second pin section (3) is designed to be shorter than the first pin section (2), in particular the length of the second pin section (3) is 0.25 times to 0.75 times that of the first pin section (2).

A3. The locking pin (1) according to one of clauses A1 or A2, characterized in that on at least one of the head ends (5, 6) is designed as a mushroom head-like and/or cap-like widening, the circumferential lower rim of which is designed as a cutting collar (5.1, 6.1).

A4. The locking pin (1) according to one of the preceding clauses, characterized in that a single- or multi-part cutting and/or friction collar (9, 14, 15) is arranged on at least one neck section (7, 8).

A5. The locking pin (1) according to one of the preceding clauses, characterized in that the locking pin (1) is made of a metal, in particular a non-rusting metal, or a plastic, in particular a PVC, PP, PET or POM.

A6. An electronics module (20), comprising a housing lower part (21), a circuit board (10) and a housing upper part (22), wherein the circuit board (10) has at least one lead-through opening (11) for fastening with a fastening means which is introduced, with a first end, in a friction-locking and/or positive-locking manner through the lead-through opening (11) into a receiving element (23), arranged aligned, of the housing lower part (21) and fastened, characterized in that: a receiving element (24) arranged aligned with the receiving element (23) of the housing lower part (21) is provided on the housing upper part (22), wherein the other end of the fastening means is introduced in a friction-locking and/or positive-locking manner into the at least one receiving element (23) of the housing upper part (22) and fastened.

A7. The electronics module (20) according to clause A6, characterized in that the housing upper part (22) and the housing lower part (21) have an edge (21.1, 22.1), wherein the edges (21.1, 22.1) are adhesively bonded to one another at least in sections, in particular are adhesively bonded to one another over the entire length.

A8. The electronics module (20) according to one of clauses A6 or A7, characterized in that the fastening means is designed as a locking pin (1) according to one of clauses A1 to A5.

A9. The electronics module (20) according to one of clauses A6 to A8, characterized in that a bar-like bearing element (27, 28) is arranged at least between a housing wall (25, 26) and one of the receiving elements (23, 24).

A10. The electronics module (20) according to one of clauses A6 to A9, characterized in that at least one receiving element (23, 24) is formed like a column and/or sleeve and attached to a housing top (29) and/or the housing top (29) is formed as a column- and/or sleeve-like receiving element (23, 24) in sections.

A11. A method for producing an electronics module (20) in which a circuit board (10) having at least one lead-through opening (11) is attached to at least one receiving element (23, 24) in a housing lower part (21) with fastening means and then a housing upper part (22) is fastened, characterized in that the following step are performed:
 a) providing the housing lower part (21)
 b) placing the circuit board (10) on the at least one receiving elements (23) of the housing lower part (21),
 c) guiding the at least one fastening means through the lead-through opening (11) and pressing it into the at least one receiving element (23), wherein the fastening means is formed as a locking pin (1) according to one of clauses 1 to 5, and
 d) pressing the head end (6) of the second pin section (3) into at least one receiving element (24) of the housing upper part (22).

A12. The production method according to clause A11, characterized in that, before step d), a sealing or adhesive material (12) is applied to and/or placed on a housing edge (21.1, 22.1) at least in sections.

A13. The production method according to one of clauses A11 or A12, characterized in that in each case at least one cutting and/or friction collar (5.1, 6.1, 9, 9.1, 14, 15) is pressed into each receiving element (23, 24) of the housing upper and lower parts in a positive-locking and/or friction-locking manner.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

What is claimed is:

1. An electronics module, comprising:
a circuit board that includes at least one lead-through opening;
a housing lower part that includes a lower receiving element attached to or integral with the housing lower part; and
a housing upper part that includes an upper receiving element, attached to or integral with the housing upper part, that is aligned with the lower receiving element;
wherein the circuit board is connected to the housing lower part in the electronics module via a locking pin that is inserted in a positive-locking manner through the lead-through opening into the lower receiving element, wherein the locking pin includes:
a contact section;
a first pin section with a first head end and a first neck section connecting the first pin section to a first side of the contact section; and
a second pin section with a second head end and a second neck section connecting the second pin section to a second, opposite side of the contact section;
wherein at least one of the first pin section or the second pin section includes a cutting or friction collar, and wherein the cutting or friction collar contacts an inner wall of the lower receiving element or upper receiving element by cutting or pushing into the inner wall.

2. The electronics module of claim 1, wherein the housing upper part includes a first edge and the housing lower part includes a second edge, and wherein the first and second edges are adhesively bonded together.

3. The electronics module of claim 1, wherein the housing lower part includes a housing wall, and wherein the lower receiving element is attached to a bearing element on the housing wall.

4. The electronics module of claim 1, wherein the housing upper part includes a housing wall, and wherein the upper receiving element is attached to a bearing element on the housing wall.

5. The electronics module of claim 1, wherein at least one of the upper receiving element or the lower receiving element is formed as a sleeve attached to a housing top of the housing upper part or the housing lower part.

6. The electronics module of claim 1, wherein at least one of the first head end or the second head end is formed as a cap-like widening having a circumferential lower rim configured as a cutting collar.

7. The electronics module of claim 1, wherein an outer surface of the cutting or friction collar is sloped such that the collar has a larger outer circumference closer to the contact section.

8. A method for producing an electronics module, the method comprising:
placing a circuit board on a lower receiving element attached to or integral with a housing lower part of the electronics module;
guiding a locking pin through a lead-through opening in the circuit board, wherein the locking pin includes:
a contact section;
a first pin section with a first head end and a first neck section connecting the first pin section to a first side of the contact section; and
a second pin section with a second head end and a second neck section connecting the second pin section to a second, opposite side of the contact section;
pressing the first head end of the locking pin into the lower receiving element of the housing lower part such that the contact section presses the circuit board towards the housing lower part; and
pressing the second head end of the locking pin into an upper receiving element attached to or integral with a housing upper part of the electronics module, wherein at least one of the first pin section or the second pin section includes a cutting or friction collar, and wherein the cutting or friction collar contacts an inner wall of the lower receiving element or upper receiving element by cutting or pushing into the inner wall during the pressing the first head end into the lower receiving element or pressing the second head end into the upper receiving element.

9. The method of claim 8, wherein the housing upper part includes a first edge and the housing lower part includes a second edge, wherein the method further comprises:
prior to pressing at least one of the first and second head ends of the locking pin into the respective lower and upper receiving elements, applying an adhesive material to at least one of the first or second edges.

10. The method of claim 8, wherein the cutting or friction collar includes one or more of:
a set of one or more barbed hooks; or
a section having a frictional surface geometry.

* * * * *